US008217346B2

(12) United States Patent
Kawata et al.

(10) Patent No.: US 8,217,346 B2
(45) Date of Patent: Jul. 10, 2012

(54) OPTICAL MICROSCOPE

(75) Inventors: Yoshimasa Kawata, Hamamatsu (JP); Atsuo Miyakawa, Hamamatsu (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 48 days.

(21) Appl. No.: 12/995,659

(22) PCT Filed: Jun. 3, 2009

(86) PCT No.: PCT/JP2009/060190
§ 371 (c)(1),
(2), (4) Date: Dec. 1, 2010

(87) PCT Pub. No.: WO2009/148094
PCT Pub. Date: Dec. 10, 2009

(65) Prior Publication Data
US 2011/0079712 A1   Apr. 7, 2011

(30) Foreign Application Priority Data
Jun. 3, 2008 (JP) ................................. 2008-146335

(51) Int. Cl.
*G01N 23/22* (2006.01)
(52) U.S. Cl. ........................................................ 250/306
(58) Field of Classification Search .................. 250/306, 250/307, 484.2
See application file for complete search history.

(56) References Cited

U.S. PATENT DOCUMENTS
6,621,575 B1   9/2003  Beuthan et al.
8,119,960 B2 *  2/2012  Fukuyama ................. 250/201.3

FOREIGN PATENT DOCUMENTS
JP   2003-524779 T   8/2003
JP   2006-308475 A   11/2006

OTHER PUBLICATIONS

Moriguchi et al., "Imaging Analysis of Near-Field Recording Technique for Observation of Biological Specimens," *Optical Review*, 13:215-217 (2006).

* cited by examiner

*Primary Examiner* — Kiet T Nguyen
(74) *Attorney, Agent, or Firm* — Marshall, Gerstein & Borun LLP

(57) ABSTRACT

An optical microscope for optically measuring a sample (30) includes: a fluorescent thin membrane (13) which at least partly contains fluorescent substance and on which the sample (30) is placed; an electron source (11) for generating an electron beam; an electron lens (12) for focusing the electron beam generated by the electron source (11) in such a manner as to excite a minute light source having a wavelength shorter than a visible light wavelength from the fluorescent thin membrane (13) so as to irradiate the fluorescent thin membrane (13) with the electron beam, and further, scanning the focused electron beam; and an optical detector (22) for detecting a measurement light beam which is generated in the minute light source and acts on the sample (30).

4 Claims, 3 Drawing Sheets

OPTICAL MICROSCOPE

TECHNICAL FIELD

The invention relates to an optical microscope.

BACKGROUND ART

A living biological sample can be observed by an optical microscope as it is. Therefore, the optical microscope is used as a very effective tool in elucidating a life phenomenon. A fluorescent probe having various functions has been developed, and further, cell functions have been elucidated and a single molecule has been observed by utilizing various optical systems such as a phase difference optical system, a confocal optical system, and a full reflection fluorescent observation. There have been many accomplishments and much expertise for a long period of time in observing a living sample by using light.

One of targets of elucidation of the life phenomenon is expected to clarify not the function of one minimum constituent element such as a cell or a protein but the interaction between plural constituent elements, the mechanism of information transmission, the mechanism of energy transmission, the dynamics of an information molecule inside of a cell. The function of an organ of a living body depends on the interaction between cells as the minimum constituent elements of the living body. As a consequence, it is necessary to clarify the interaction between the cells so as to elucidate the detailed mechanism of the organ. In addition, it is necessary to understand the dynamics of plural living molecules by observation at real time.

In the meantime, a spatial resolution by the optical microscope is restricted by properties of an optical wave, and therefore, the resolution can be achieved in only the order of submicron. As a consequence, it is necessary to develop an optical microscope having a higher spatial resolution so as to elucidate the interaction between plural molecules or minute organs and an information transmission mechanism.

A near-field microscope has been known as a microscope for optically observing a minute region in excess of an optical diffraction limit. FIG. 1 is a diagram illustrating the principle of a near-field microscope. As illustrated in FIG. 1, a laser beam is incident into a tip of a probe shielded with metal. An aperture is formed at the tip of the probe in several nm to several tens nm. The aperture is very smaller than an optical wavelength, and therefore, the laser beam incident into the tip of the probe cannot pass through the aperture. However, a part of the laser beam evanesces from the aperture by a so-called near-field effect (i.e., an evanescent wave). The interaction between a near-field light beam evanescing from the tip of the probe and an object to be measured is observed.

The use of the near-field microscope achieves the observation of the minute region smaller than the optical wavelength. However, the tip of the probe need be observed in the proximity of the object to be measured by the near-field microscope. Hence, the object to be measured is observed while it is scanned by the probe, as illustrated in FIG. 2, thereby taking much time in observing a two-dimensional image. Although the observation at real time is needed for observing the dynamics of a living body, the near-field microscope in the prior art cannot achieve the observation at real time.

Japanese Patent Application Laid-open (JP-A) No. 2003-524779 and JP-A No. 2006-308475 are listed as prior art literature relating to the invention. JP-A) No. 2003-524779 discloses a near-field microscope using a near-field light beam, in which a near field is produced with the irradiation of light beams through plural pores at nano scale. Moreover, JP-A) No. 2003-524779 suggests excitation of a light beam with an electron beam.

JP-A No. 2006-308475 discloses a near-field microscope for irradiating a living sample with a light beam, converting a generated near-field light beam into an electron beam by an optoelectronic conversion membrane, and detecting the electron beam.

DISCLOSURE OF INVENTION

Problems to be Solved by the Invention

As described above, there has been a limit in resolution by the optical diffraction limit in the optical microscope in the prior art. In the meantime, although the near-field microscope has used as a microscope for optically observing an object in excess of the optical diffraction limit, the probe need scan an object to be observed in the vicinity of it, thereby raising the problem of much time taken in forming an image.

An object of the invention is to solve the problem to be solved so as to provide an optical microscope capable of acquiring near-field information at a high speed with a resolution in excess of an optical diffraction limit.

Means for Solving the Problems

In order to achieve the above object, an optical microscope of the invention is the optical microscope for optically measuring an object to be measured, and the optical microscope includes: a fluorescent member that comprises a fluorescent substance in at least a portion thereof and on which the object to be measured is placed; an electron beam generating component that generates an electron beam; an electron beam controlling component that focuses the electron beam generated by the electron beam generating component, such that the fluorescent member is irradiated by the electron beam and a minute light source having a wavelength shorter than a visible light wavelength is excited from the fluorescent member, and that makes the focused electron beam scan; and an optical detecting component that detects a measurement light beam that is generated at the minute light source and acts on the object to be measured.

The optical microscope of the invention is an optical microscope for optically measuring an object to be measured, the optical microscope includes: a fluorescent member that comprises a fluorescent substance in at least a portion thereof and on which the object to be measured is placed; an electron beam generating component that generates an electron beam; an electron beam controlling component that controls the electron beam generated by the electron beam generating component, such that the fluorescent member is irradiated by the electron beam and a minute light source having a size smaller than a visible light wavelength is excited in the fluorescent member; and an optical detecting component that detects a measurement light beam that is generated at the minute light source and acts on the object to be measured.

Effects of the Invention

According to the invention, it is possible to acquire near-field information at a high speed with a resolution in excess of an optical diffraction limit.

BEST MODES FOR CARRYING OUT THE INVENTION

Figure 1:
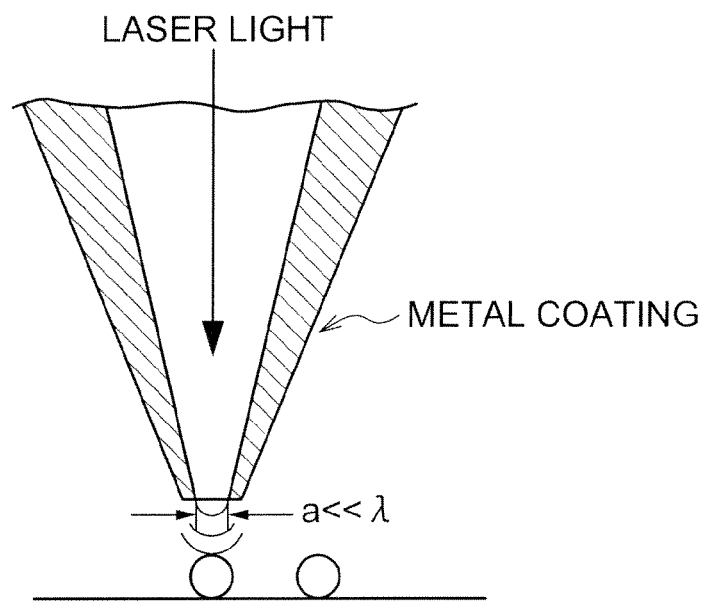
FIG. 1 is a diagram illustrating the principle of a near-field microscope in the prior art.
Figure 2:
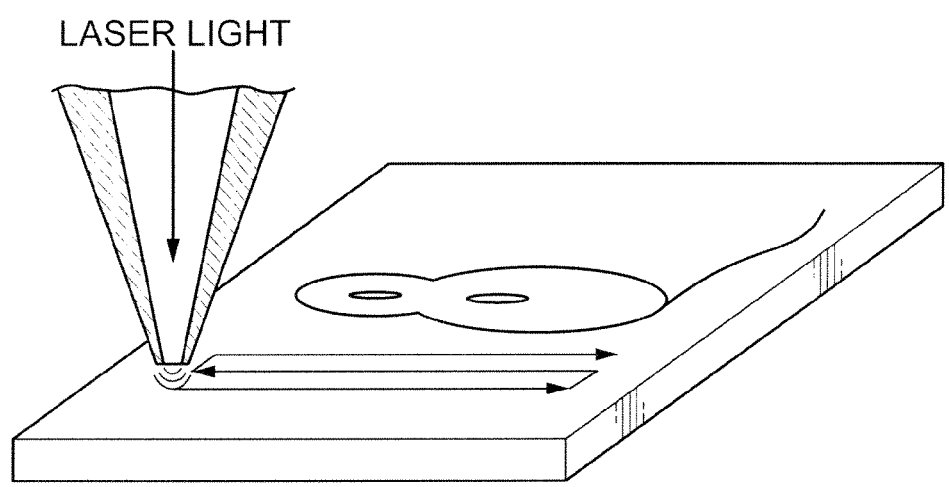
FIG. 2 is a diagram illustrating scanning by the near-field microscope in the prior art.
Figure 3:
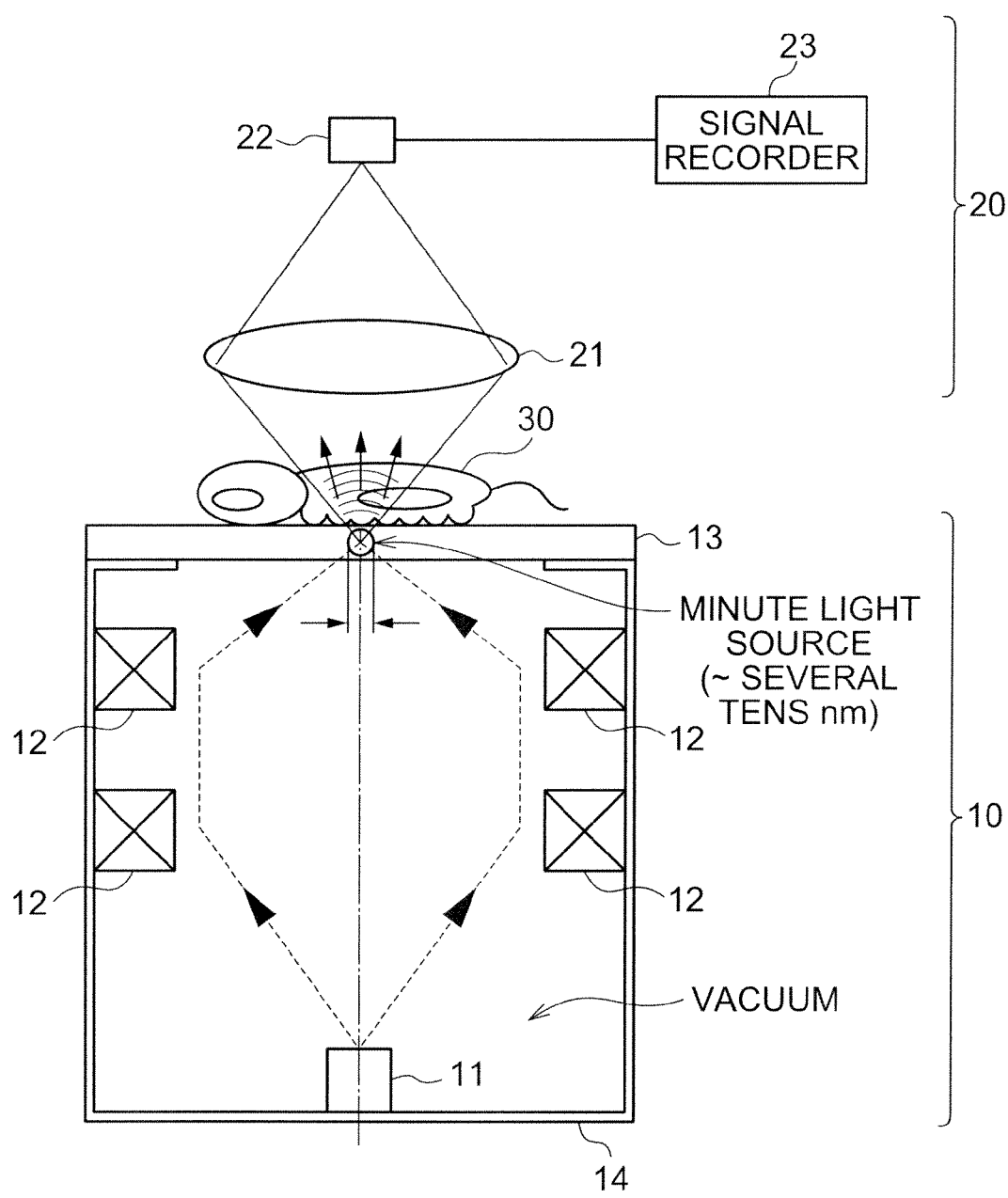
FIG. 3 is a view showing the configuration of an optical microscope in an exemplary embodiment according to the invention.

A description will be given below of an exemplary embodiment according to the invention. FIG. 3 is a view showing the configuration of an optical microscope in an exemplary embodiment according to the invention. The optical microscope includes an electron microscope focusing system 10 and an optical microscope unit 20.

The electron microscope focusing system 10 includes an electron source 11 for emitting an electron beam, an electron lens 12 for focusing the electron beam emitted from the electron source 11 at a predetermined position, a fluorescent thin membrane 13 to be irradiated with the electron beam, and a vacuum container 14 whose inside is in a vacuum. The electron source 11 and the electron lens 12 are housed inside of the vacuum container 11. The fluorescent thin membrane 13 is stuck onto a partition wall in such a manner as to close a through hole formed on the partition wall of the vacuum container 11, and therefore, serves as a part of the partition wall. A sample 30 is placed over the through hole and on the fluorescent thin membrane 13.

On the other hand, the optical microscope unit 20 includes an objective lens 21 for focusing light beams from the sample 30, an optical detector 22 for detecting the light beam from the objective lens 21, and a signal recorder 23 for recording a signal detected by the optical detector 22, as shown in FIG. 3.

In FIG. 3, the fluorescent thin membrane 13 is apparently formed at the entire upper surface of the vacuum container 14, but actually, it is designed to close the minute through hole formed on the partition wall at the upper surface so as to endure atmospheric pressure. This configuration will be described later.

The electron beam generated from the electron source 11 is focused within the fluorescent thin membrane 13 (e.g., in the order of several tens nm) by the electron lens 12. The light beam is excited within the fluorescent thin membrane 13 by the focused electron beam, and then, a fine light source (~several tens nm) is produced. Incidentally, the electron beam can be controlled in an electric field or a magnetic field. Therefore, the fine light source can be excited at an arbitrary position within a fluorescent member by controlling the electron beam, thereby achieving secondary scanning.

The fine light source has a diameter smaller than a visible light wavelength when it is formed into a spherical shape (inclusive of substantially spherical shape) whereas its shortest axis has a length smaller than the visible light wavelength when it is formed into shapes other than the spherical shape. The light beam produced by the interaction between the fine light source and the sample 30 passes through the objective lens 21, and then, is detected by the optical detector 22. A signal produced in the optical detector 22 with the light beam emitted from the objective lens 21 is recorded in the signal recorder 23.

A member obtained by dispersing a fluorescent material (i.e., fluorescent substance) in a transparent material may be adopted as a fluorescent light emitting layer (i.e., the fluorescent member 13). A silicon oxide film ($SiO_2$), glass, or a polymeric material may be used as the transparent material. The thickness of the fluorescent light emitting layer is sufficiently about 1 μm, but it may be less than the visible light wavelength.

A preferred example of the transparent polymeric material as a medium for dispersing the fluorescent material is polymethyl methacrylate (PMMA) for use in fine machining as a high resolution resist. The molecular structure of PMMA is expressed by $(CH_2C-CH_3-COOCH_3)_n$ (where n represents a polymerization degree). For example, PMMA having a molecular weight of about 7.0 to $7.5 \times 10^5$ may be used. PMMA has higher transparency than other polymeric resins, and therefore, has excellent optical characteristics.

A rhodamine- or coumarin-based organic fluorescent pigment may be used as the fluorescent material to be dispersed in the transparent material. The rhodamine-based fluorescent pigment includes molecules which has a melting point of higher than 200° C., and therefore, is readily dissolved in an organic solvent such as methanol, and further, shows orange fluorescence with the irradiation of a green light beam. For example, rhodamine 590 having a molecular weight of 543.1 may be used. The concentration of rhodamine in PMMA should be preferably, for example, about 2 wt %.

A solvent is prepared by blending the fluorescent material into resin glass such as a polysiloxane polymer. Rhodamine or semiconductor fine particles are dissolved in the resin glass by using a solvent such as acetone, propanol, or propylene glycol methyl ether acetate (PGMEA). A maleic acid solution is dropped into a 1-proxy-2-propanol (PGPE) solution of tetramethoxysilane (TMOS) heated up to 60° C., and then, the rhodamine or semiconductor fine particles are blended into the resultant solution, followed by heating and agitating the blend at 60° C. for 4 hours, before decompression and condensation, resulting in a siloxane resin solution including the fluorescent material. As the resin glass may be used a perhydrogenated silazane polymeric solution which attracts attention as an application type solution in which an element separation insulating film is embedded in an STI groove of a semiconductor device of 100 nm generation onwards, i.e., an SOG (spin-on-glass) solution.

The fluorescent microscope which observes fluorescence emitted by irradiating fluorescent substance within a cell or tissue with an excitation light beam such as an ultraviolet ray is widely utilized in various biological fields of secondary fluorescence, in which a cell dye fluorescent pigment such as acridine orange or 4,6-diamidine-2-phenyl indole (DAPI) is added, a fluorescent antibody method, and the like in addition to fluorescence including natural fluorescent substance such as chlorophyll, lipid, or vitamin (self-fluorescence). Examples of inorganic fluorescent materials include YAG such as $Y_3Al_5O_{12}:Ce^{3+}$ ($YAG:Ce^{3+}$).

In the case of the semiconductor fine particles (i.e., a semiconductor particle phosphor), a visible light beam having an arbitrary wavelength can be achieved by a single excitation light beam. Examples of the semiconductor particle phosphor include CdSe/ZnS semiconductor fine particles. A polysilazane (PSZ) membrane containing a fluorescent material can be obtained by baking the perhydrogenated silazane polymeric solution at 150° C. for 3 minutes. When the CdSe/ZnS semiconductor fine particles are used as the fluorescent material, the polysilazane (PSZ) membrane is formed, followed by oxidation in the atmosphere containing steam at a temperature of higher than 200° C. and 600° C. or lower, thereby obtaining a resin glass membrane (i.e., a silicon oxide membrane) containing a fluorescent material having a high definition.

Figure 4:
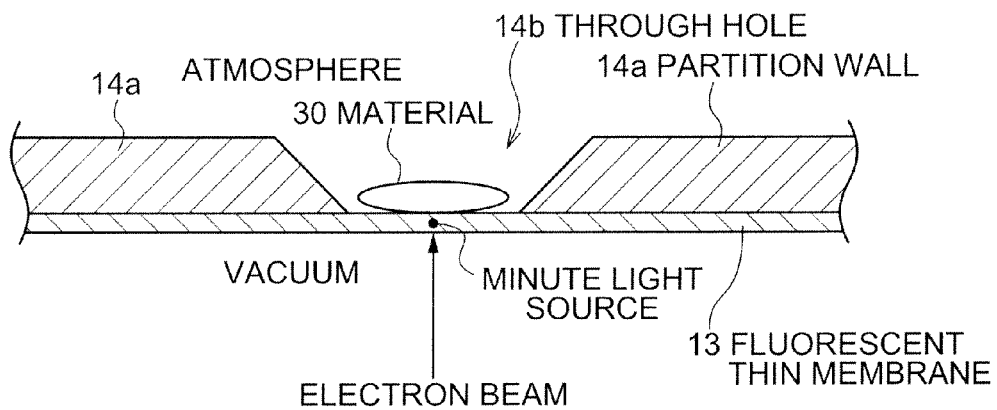
FIG. 4 is a view showing one example of the arrangement of a partition wall of a vacuum container and a fluorescent thin membrane.

FIG. 4 is a view showing one example of the arrangement of the partition wall of the vacuum container 14 and the fluorescent thin membrane 13. A fine through hole 14b is formed on a partition wall 14a of the vacuum container 14, to which the fluorescent thin membrane 13 is stuck. The sample 30 as an object to be measured is placed in the through hole 14b and on the fluorescent thin membrane 13. Since the electron beam is contained on a vacuum side inside of the vacuum container 14 whereas the sample 30 is placed on the atmospheric side thereof, the fluorescent thin membrane 13 having the sample 30 placed thereon needs to serve as a part of the partition wall of the vacuum container 14. However, the fluorescent thin membrane 13 does not have a satisfactory strength, and therefore, some contrivance is needed to support the atmosphere. FIG. 4 shows an example in which a relatively small sample 30 is placed. The through hole 14b is formed on the partition wall, for arranging the fluorescent thin membrane 13.

Figure 5:
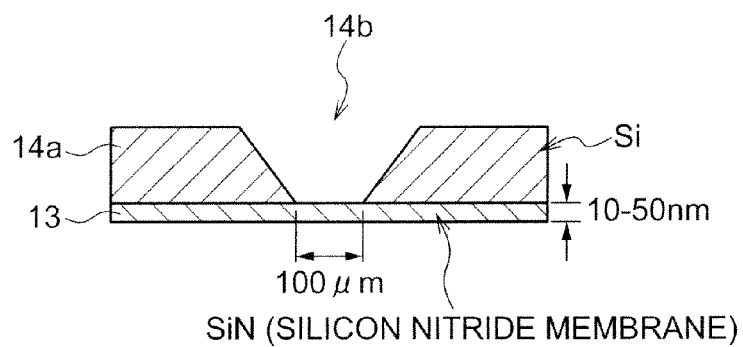
FIG. 5 is a cross-sectional view showing, in enlargement, the principal parts of the partition wall and fluorescent thin membrane.

FIG. 5 is a cross-sectional view showing, in enlargement, principal parts of the partition wall and the fluorescent thin membrane 13. The inner diameter of a smallest portion of the through hole 14b is, for example, about 100 μm. Therefore, even if the fluorescent thin membrane 13 is so thin as not to have a satisfactory strength, it can sufficiently support the atmosphere. Although the thickness of the fluorescent thin membrane 13 is not specifically limited, it should be preferably about 10 to 50 nm, for example. Although the material for the partition wall around the fluorescent thin membrane 13 is not specifically limited, it should be desirably Si which is easy to be machined.

When a silicon substrate for a semiconductor device or the like is used as the partition wall, a substrate is etched with a KOH solution such that surface orientation (100) is referred to as a surface whereas a side surface of the through hole is referred to as a (111) surface so as to precisely form the through hole etching with a KOH solution. In this case, the bottom angle of an etched surface is substantially 54.7° and the vertex angle of the resultant square pyramid is substantially 70.6°. Besides silicon, diamond or mixed crystal such as GaAs may be used by utilizing an angle determined by crystallinity by etching. A conductor made of metal or the like is disposed on the resultant partition wall by vacuum deposition or the like, thereby serving as an anode capable of receiving the electron beam.

Figure 6:
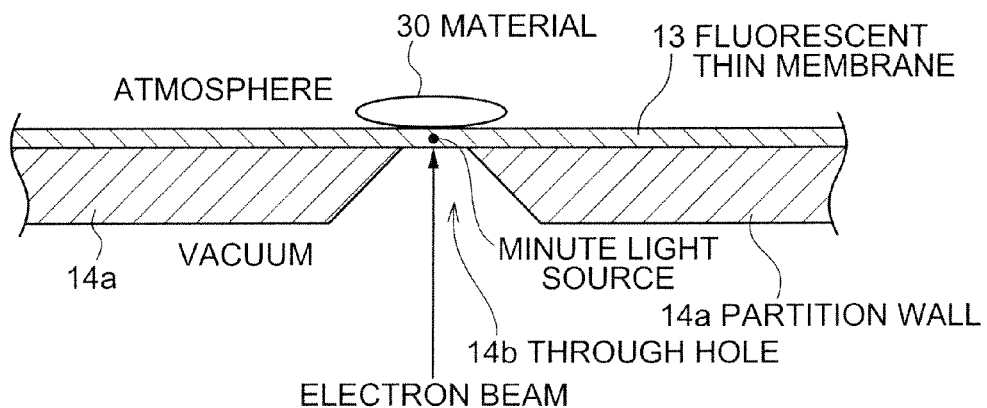
FIG. 6 is a view showing another example of the arrangement of a partition wall of a vacuum container and a fluorescent thin membrane.

FIG. 6 is a view showing another example of the arrangement of the partition wall of the vacuum container 14 and the fluorescent thin membrane 13. In this example, the fluorescent thin membrane 13 is arranged on the atmospheric side of the partition wall. With this arrangement, the size of the sample 30 is not restricted, and therefore, the sample 30 can be readily placed. Although the size of the through hole is not specifically limited, for example, the inner diameter may be less than the visible light wavelength (i.e., about several tens nm). The sample 30 is hardly influenced by various disturbances by reducing the size of the through hole, and further, the electron beam is readily converged, thereby enhancing measurement precision of a near-field effect. Moreover, when the inner diameter of the through hole is reduced, the strength of the fluorescent thin membrane 13 can be reduced, thereby reducing the thickness of the fluorescent thin membrane 13.

In this manner, the utilization 30 can be made to approach the near field, thus enabling the measurement at a very high precision (i.e., resolution).

In addition, imaging can be achieved by forming plural through holes. Specifically, various samples may be placed on through holes, respectively. This enables simultaneous measurement of the plural samples at real time.

As described above, in the optical microscope in the exemplary embodiment according to the invention, the information on the near field of the resolution in excess of the optical diffraction limit can be acquired at a high speed, the living biological sample can be observed at real time by using the light beam, and thus, a nano imaging technique can be achieved with the spatial resolution of nano meter order at real time. The optical microscope can integrally observe the functional analysis from the level of a molecule or protein to the level of a cell or organ by implementing the high resolution with which the observation can be achieved at real time.

The optical microscope can excite the minute light source inside of the fluorescent member by using the electron beam which can be emitted in a small region, so that the minute light source can be produced in the size of less than the visible light wavelength, and further, it can collect the information on the near field of the order of nano meter since it uses the minute light source having the size of less than the visible light wavelength. Moreover, the optical microscope uses the electron beam for exciting the minute light source, and therefore, can readily control the electron beam and achieve high-speed scanning, thus obtaining an image of a near field at a high speed. In addition, the optical microscope applies the technique of the electronic microscope to the optical excitation, so as to implement the minute light source which has a spot of 10 nm or less and can scan at a high speed. Additionally, the optical microscope selects the material having the light emitting wavelength, the polarization characteristics, and the like for the fluorescent member, so as to enhance the function of spectral measurement or polarimetry.

In principle, the irradiation of the sample with the minute light source produced on the fluorescent thin membrane is completely identical to the irradiation of the sample with an evanescent wave produced at a fine aperture in the near-field optical microscope. When the distance between the sample and the fluorescent thin membrane is sufficiently small, the sample can be observed with the evanescent wave of the minute fluorescent light source produced by the electron beam excitation, thereby achieving the resolution in excess of the diffraction limit.

As a consequence, the application of the optical system of the optical microscope which has been already developed up to now to the detecting system enables the detecting system having the high spatial resolution and many functions to be constructed. In addition, since the optical microscope unit and the electron microscope unit are separated at the fluorescent thin membrane, on which the sample is placed, the portion, on which the sample is placed, need not at all be in a vacuum, and further, the metallic membrane need not at all be deposited. Thus, the optical microscope can be used in the same environment as a normal optical microscope.

Although one exemplary embodiment according to the invention has been described above, the invention is not limited to this. It is to be understood that various modifications should be embodied within the scope of the technical idea claimed in claims.

The invention claimed is:

1. An optical microscope that optically measures an object to be measured, the optical microscope comprising:

a fluorescent member that comprises a fluorescent substance in at least a portion thereof and on which the object to be measured is placed;

an electron beam generating component that generates an electron beam;

an electron beam controlling component that focuses the electron beam generated by the electron beam generating component, such that the fluorescent member is irradiated by the electron beam and a minute light source having a wavelength shorter than a visible light wavelength is excited from the fluorescent member, and that makes the focused electron beam scan; and an optical detecting component that detects a measurement light beam that is generated at the minute light source and acts on the object to be measured.

2. The optical microscope of claim 1 further comprising a vacuum container having a vacuum unit that houses the electron beam generating component and the electron beam controlling component therein, wherein:

the fluorescent member is disposed at a portion of a through hole formed on a partition wall of the vacuum container, so as to serve as a part of the partition wall; and the minute light source is excited by the electron beam, which passes through the through hole.

3. The optical microscope of claim 1, comprising a plurality of the through holes.

4. An optical microscope for optically measuring an object to be measured, the optical microscope comprising:

a fluorescent member that comprises a fluorescent substance in at least a portion thereof and on which the object to be measured is placed;

an electron beam generating component that generates an electron beam;

an electron beam controlling component that controls the electron beam generated by the electron beam generating component, such that the fluorescent member is irradiated by the electron beam and a minute light source having a size smaller than a visible light wavelength is excited in the fluorescent member; and an optical detecting component that detects a measurement light beam that is generated at the minute light source and acts on the object to be measured.

* * * * *